(12) United States Patent
Ramamoorthy et al.

(10) Patent No.: US 7,413,586 B2
(45) Date of Patent: Aug. 19, 2008

(54) IN-TOOL AND OUT-OF-TOOL PROTECTION OF EXTREME ULTRAVIOLET (EUV) RETICLES

(75) Inventors: Arun Ramamoorthy, Milipitas, CA (US); Robert Bristol, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 783 days.

(21) Appl. No.: 10/789,670

(22) Filed: Feb. 27, 2004

(65) Prior Publication Data

US 2005/0191565 A1 Sep. 1, 2005

(51) Int. Cl.
- *F26B 7/00* (2006.01)
- *G03B 27/58* (2006.01)
- *G03B 27/42* (2006.01)
- *B65D 85/48* (2006.01)
- *G03F 9/00* (2006.01)
- *A47L 13/15* (2006.01)
- *D02G 3/00* (2006.01)

(52) U.S. Cl. .......... 55/385.1; 55/DIG. 59; 55/486; 96/155; 96/132; 96/59; 96/66; 355/72; 355/53; 355/73

(58) Field of Classification Search .......... 55/385.1, 55/DIG. 59; 96/59, 66; 355/72
See application file for complete search history.

(56) References Cited

U.S. PATENT DOCUMENTS 4,323,374 A * 4/1982 Shinagawa et al. .......... 96/58
6,162,535 A * 12/2000 Turkevich et al. .......... 428/372
6,421,113 B1 * 7/2002 Armentrout .................. 355/75
6,513,184 B1 * 2/2003 Brown et al. ................. 15/231
6,646,720 B2 * 11/2003 Ramamoorthy et al. ..... 355/72
6,763,608 B2 * 7/2004 Dao et al. ..................... 34/380

OTHER PUBLICATIONS

Kravtsov, A.G., et al., "Analysis of the polarization state of melt-spun polypropylene fibers", *Journal of Materials Processing Technology*, 124(1-2):160-165, Jun. 2002.
Tsai, P.P., et al., "Different electrostatic methods for making electret filters", *Journal of Electrostatics*, 54(3-4):333-341, Mar. 2002.
Chauhan, M.M., et al., "Photoresist Outgassing in EUV", *2000 March Meeting: Bulletin of the American Physical Society*, 45(1):563, abstract #L36.112, Mar. 2000.
Moors, R., et al., "Electrostatic mask protection for extreme ultraviolet lithography", *Journal of Vacuum Science & Technology B: Microelectronics and Nanometer Structures*, 20(1):316-320, Jan./Feb. 2002.

* cited by examiner

*Primary Examiner*—Duane Smith
*Assistant Examiner*—Ives Wu
(74) *Attorney, Agent, or Firm*—Fish & Richardson P.C.

(57) ABSTRACT

A reticle carrier for an Extreme Ultraviolet (EUV) reticle may include nested grids of electret fibers to provide active protection from contamination without a power supply. The reticle carrier may include in-line sensors for in-situ monitoring of contamination. Grids of electret fibers may also be used in an EUV pellicle.

8 Claims, 6 Drawing Sheets

ELEVATION VIEW

PLAN VIEW

ELEVATION VIEW

IN-TOOL AND OUT-OF-TOOL PROTECTION OF EXTREME ULTRAVIOLET (EUV) RETICLES

BACKGROUND

Lithography is used in the fabrication of semiconductor devices. In lithography, a light sensitive material, called a "photoresist", coats a wafer substrate, such as silicon. The lithography tool may include a mask with a pattern including transparent and opaque regions. When the wafer and mask are illuminated, light is transmitted through the transparent regions of the mask and onto the photoresist, causing the exposed regions of the photoresist to undergo chemical reactions. The photoresist is then developed to produce a replicated pattern of the mask on the wafer.

Conventional lithography systems may include a pellicle to block particles from reaching the mask surface. A pellicle is a thin transparent layer stretched over a frame above the surface of the mask. Any particles that land on the pellicle are out of the focal plane and should not form an image on the wafer being exposed.

Extreme Ultraviolet (EUV) lithography is a promising future lithography technique. EUV light may be produced using a small, hot plasma that will efficiently radiate at a desired wavelength, e.g., in a range of approximately 11 nm to 15 nm. The plasma may be created in a vacuum chamber, typically by driving a pulsed electrical discharge through the target material or by focusing a pulsed laser beam onto the target material. The light produced by the plasma is then collected by nearby mirrors and sent downstream to the rest of the lithography tool.

EUV lithography systems use reflective masks. Conventional pellicle materials are not suitable for such systems. Currently, the strategy is to simply handle the mask in such a way to minimize the chance of particles from falling onto the mask. However, even one particle falling on a pellicle-less EUV mask may significantly affect the yield, making it very important to keep the mask surface free from defects.

DETAILED DESCRIPTION

Figure 1:
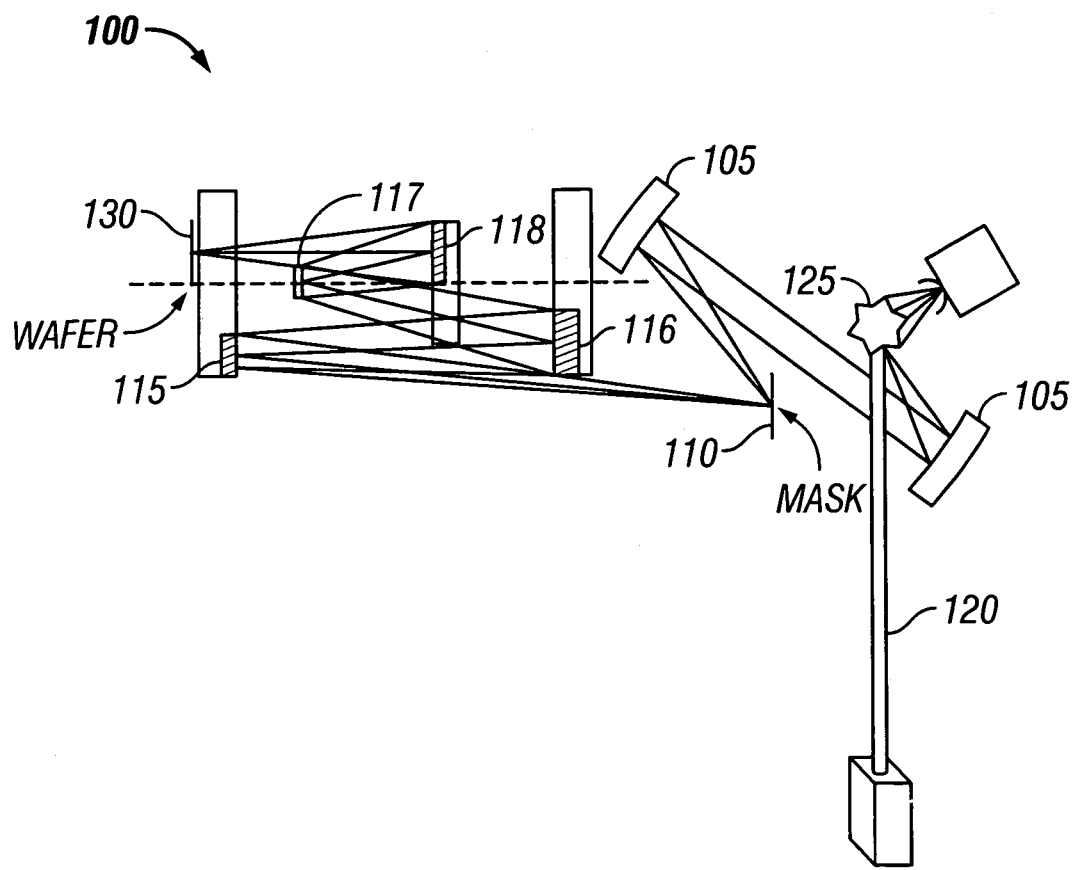
FIG. 1 is a block diagram of an EUV lithography tool.

FIG. 1 illustrates an exemplary Extreme Ultraviolet (EUV) lithography tool 100. EUV lithography is a projection lithography technique which may use a reduction optical system and illumination in the soft X-ray spectrum (wavelengths in the range of about 11 nm to 15 nm). The lithography tool 100 may include a source of EUV light, condenser optics 105, a mask 110, and an optical system including mirrors 115-118.

The mirrors in the system are made to be reflective to EUV light of a particular wavelength (e.g., 13.4 nm) by means of multilayer coatings (typically of Mo and Si). As EUV is strongly absorbed by materials and gases, the lithography process may be carried out in a vacuum, and a reflective, rather than transmissive, mask (also referred to as a "reticle") 110 may be used.

The source of soft X-rays may be a compact high-average-power, high-repetition-rate laser 120 which impacts a target material 125 to produce broad band radiation with significant EUV emission. The target material may be, for example, a noble gas, such as Xenon (Xe), condensed into liquid or solid form. The target material may convert a portion of the laser energy into a continuum of radiation peaked in the EUV. Other approaches may also be taken to produce the EUV plasma, such as driving an electrical discharge through the noble gas.

The condenser optics 105 may collect EUV light from the source and condition the light to uniformly illuminate the mask. The radiation from the condenser optics 105 may be directed to the mask 110. The mask may include reflecting and absorbing regions. The reflected EUV radiation from the mask 110 may carry an IC pattern on the mask 110 to a photoresist layer on a wafer 130 via the optical system including the multilayer mirrors. The entire mask may be exposed onto the wafer 130 by synchronously scanning the mask and the wafer, e.g., by a step-and-scan exposure.

EUV masks are very sensitive to defects. Even one particle falling onto an EUV mask may significantly affect the yield. Also, EUV masks may include a conductive film on the backside of the mask to aid in electrostatic chucking to the stage. Accordingly, it is very important to protect both sides of the mask from contamination while out of the tool, e.g., for shipping or storage.

In an embodiment, "electret" fibers are used to provide active protection in the reticle carrier. Grids of these electret fibers act as particle traps, preventing particles from depositing onto the surfaces of the mask.

Figure 2:
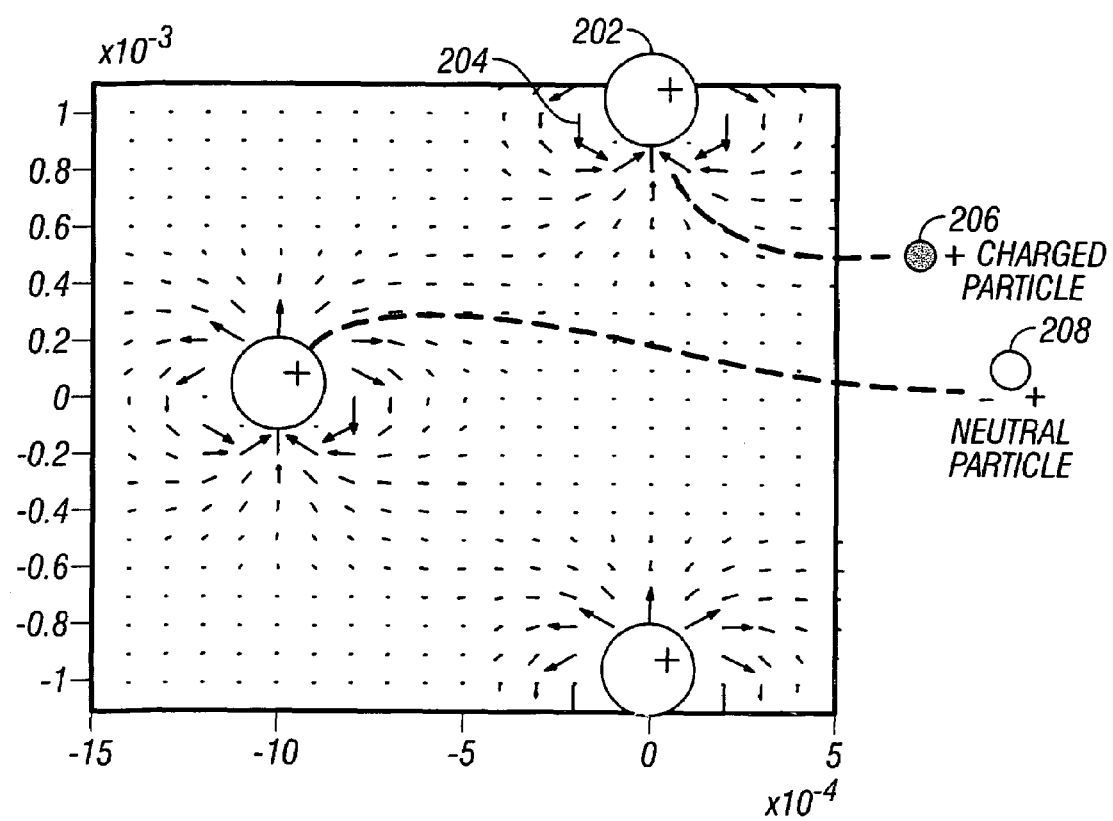
FIG. 2 is a plot showing the dipole moments of electret fibers in a grid.

Electret fibers 202 are imbued with an electret dipole field 204, as shown in FIG. 2. This field in turn attracts charged particles 206 to the fibers. The electret dipole field also attracts neutral particles 208; the field generates a dipole moment in the uncharged particles 208, which then follow the gradient of the field into the fiber.

Electret fibers are commercially available. Electret fibers may be produced by polymer melt-blowing with either corona charging or electrostatic fiber spinning. In the latter technique, the fibers are continuously released in liquid state out of a die and into a region of a strong electric field. After some distance the fiber crystallizes with the electric field embedded in it. Fiber thickness can reach below 1 micron, although 100 micron fibers may be used in the electret grids of the reticle carrier for mechanical reliability.

Figure 3:
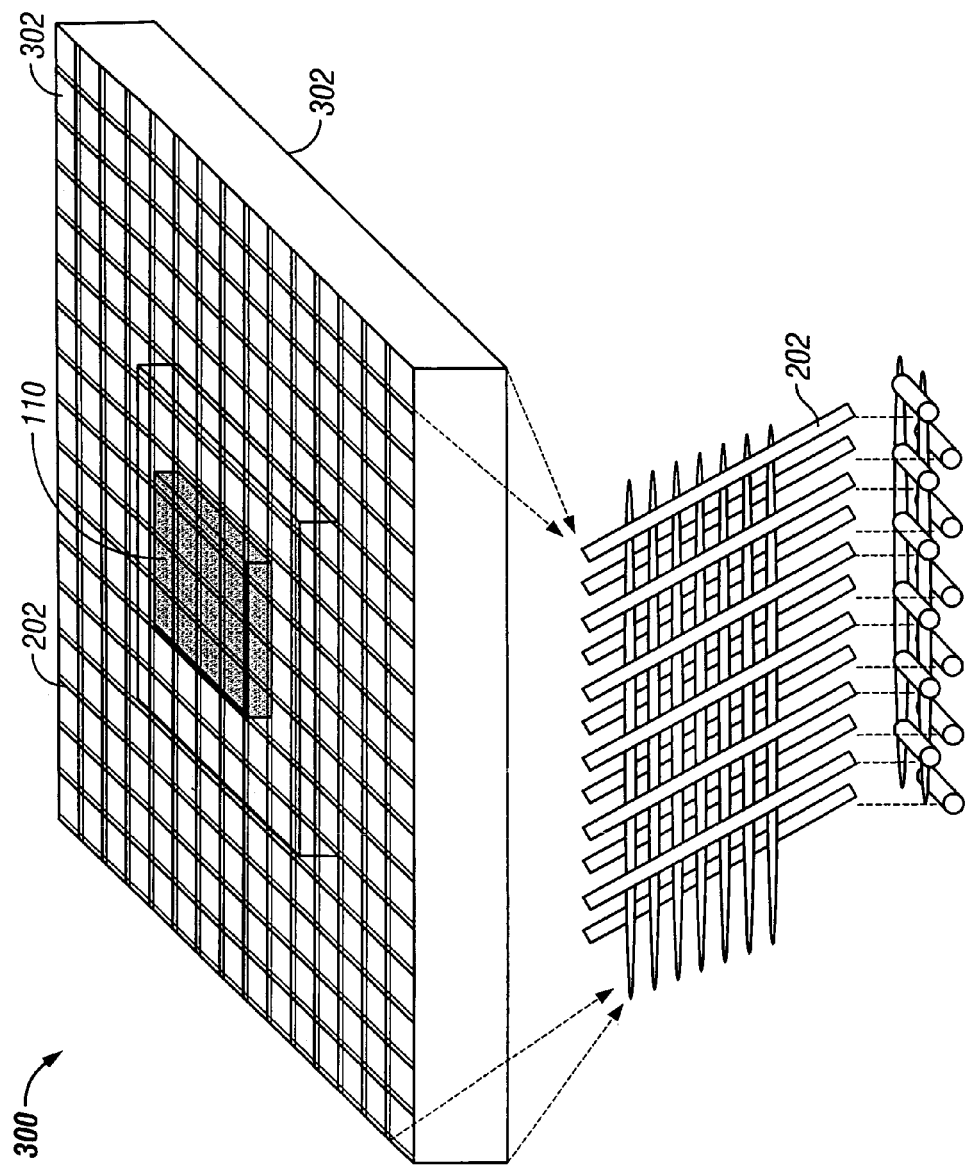
FIG. 3 is a perspective view of a reticle carrier including nested grids of electret fibers.

FIG. 3 shows a reticle carrier 300 according to an embodiment. Two nested grids 302 of electrets 202, one for each side of the mask 110 may be attached to the reticle carrier 300 to protect the surface of the mask from particles.

The layers of electret fibers in each nested grid may be arranged in a staggered fashion. This may help to capture particles that might pass through one of the layers. In an embodiment, the electret fibers have a diameter of 100 μm and a dipole of polarization 10 $nC/cm^2$ and radius of 1 mm. The electric fields generated by the fibers in the grid may be strong enough to sweep charged particles and to induce a polarization in the neutral particles, thus effectively preventing them from depositing onto the mask. The dipole moments of the electret fibers may be chosen to be aligned in their minimum energy configuration, as shown in FIG. 2. If any other configuration were attempted the wires would have a tendency to twist until they again reached the minimum energy state.

The grids may accumulate particles over time. It may be desirable to replace he grids at appropriate time intervals in order to minimize any degradation of the protection over time.

Since the dipoles in the electret fibers 202 are permanent, no external power supply is needed for implementing this electrostatic protection in the reticle carrier 300. Thus, the danger of power supplies failing during transport or storage is avoided.

In the absence of active protection, the mask surfaces may need to be inspected for contaminants before they are loaded into the lithography tool. However, there is a high probability of particles and contaminants depositing onto the mask each time the mask is taken out for inspection.

In an embodiment, in-line sensors are used for monitoring surface contamination inside an EUV reticle carrier. This provides in-situ data on the contamination levels inside the carrier without having to take the mask out of the carrier for inspection, thereby avoiding the risk of contamination during inspection.

Figure 4A:
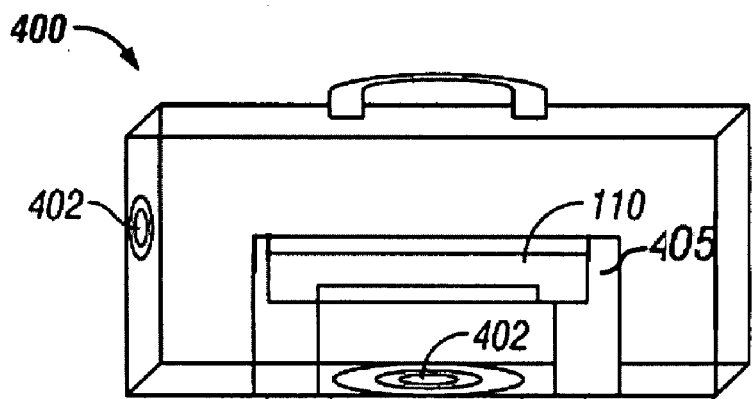
FIG. 4A is a sectional view of a reticle carrier including an in-line monitoring system.
Figure 4B:
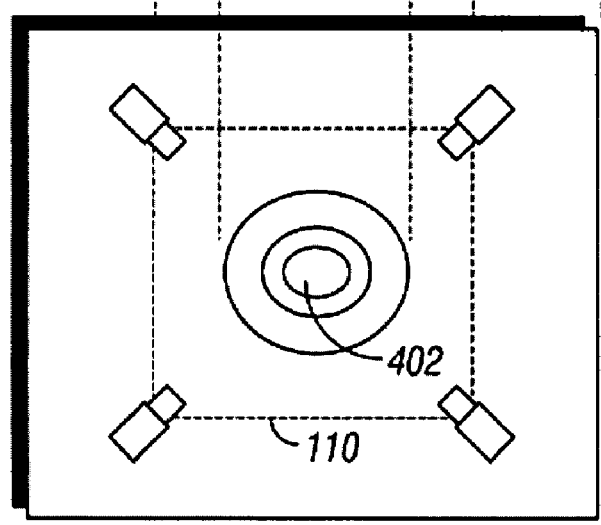
FIG. 4B is a plan view of the reticle carrier shown in FIG. 4A.

FIGS. 4A and 4B are section and plan views of a reticle carrier 400 that enables in-situ monitoring of the mask surface. Quartz crystal microbalance (QCM) or surface acoustic wave (SAW) sensors may be used as in-line sensors. QCM sensors are piezoelectric devices fabricated for a thin plate of quartz with electrodes affixed to each side of the plate. QCM sensors utilize the converse piezoelectric effect to determine mass changes as a result of frequency change of the crystal. QCM sensors are an extremely sensitive mass sensor, capable of measuring mass changes in the nanogram range. SAW sensors operate similarly to the QCM sensors. A vibratory resonance wave is excited in a piezoelectric crystal, usually quartz. The resonant frequency decreases as mass is deposited on the surface. In a SAW sensor, the wave travels along the surface instead of traveling through the crystal bulk, as in QCM.

The reticle carrier 400 in FIGS. 4A and 4B include QCM foil 402 in-line sensors. The sensors may be embedded into the walls of the reticle carrier with an external I/O (Input/Output) interface for measuring the contamination levels. This circumvents the need for taking the mask out of the carrier for inspection and also provides real-time, in-situ data on the contamination levels inside the carrier.

The mask 110 may be placed upside down in a mask holder 405, with the patterned side facing the bottom of the carrier. One sensor may be placed directly below the patterned area to monitor contamination levels there. There may be additional sensors placed on the sidewalls of the carrier. Sticky polymers or other appropriate materials may be put on the surface of these QCM foils to capture the particles. However, care needs to be taken to ensure that these materials do not outgas or generate particles.

In an embodiment, QCM foils with a 7.995-MHz fundamental frequency, density of 2.684 g/cm$^3$, and shear modulus of 2.947×10$^{11}$ g/cm·s$^2$ are used for sensors. The functioning of the QCMs is based on the following equation:

$$\Delta f = -2 f_0 \Delta m / [A \sqrt{\mu \rho}]$$

Where $f_0$ is the resonant frequency of the fundamental mode of the crystal, A is the area of the disk coated onto the crystal, $\rho$ is the density of the crystal, and $\mu$ is the shear modulus of quartz. Using the equation, it can be seen that a net change of 1 Hz corresponds to 1.36 ng of material adsorbed or desorbed onto a crystal surface with an area of 0.196 cm$^2$.

Figure 5:
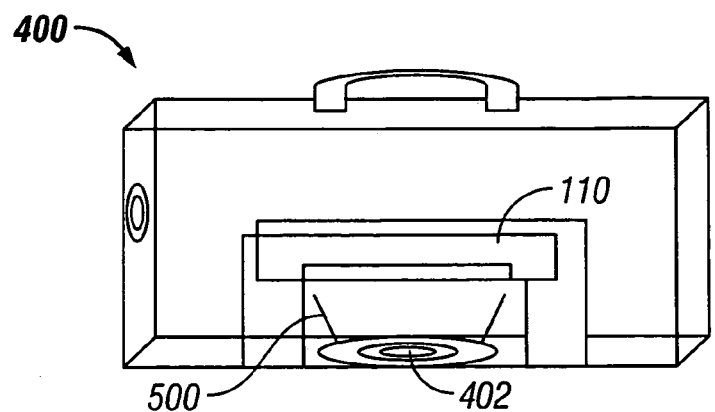
FIG. 5 is a sectional view of a reticle carrier including an in-line monitoring system and a funnel.

In an embodiment, a non-stick funnel 500 may be placed under the mask 110 to concentrate funnel the particles onto the QCM foil, as shown in FIG. 5. For particle monitoring, a funnel with a 100:1 contraction ratio would allow a 100× x smaller area, and thus would make $\Delta f$ 100x more sensitive. Thus 1 Hz would correspond to about 0.01 ng, or a single SiO$_2$ particle of about 2 microns in radius. Particles may also stick to the funnel, which may be replaced periodically.

The readouts from the QCM or SAW sensors may be done at specified points in the flow, such as at incoming inspection in the fab or prior to loading into the exposure tool. Based on the surface contamination levels, the operator can decide if the mask needs to be cleaned in the fab or not.

In an embodiment, a power supply may be built into the reticle management system or storage rack to enable constant monitoring of the sensors for real-time data acquisition during storage.

The electret fiber particle trap and in-line monitoring system may be used separately or in combination in the reticle carrier.

The mask may also be susceptible to contamination while in the lithography tool. Sources of contamination include the plasma EUV source, residue deposited on the optics from hydrocarbon cracking, or any points of mechanical contact within the tool.

In an embodiment, grid(s) of electret fibers may be used as a pellicle. In conventional (transmissive) lithography systems, a pellicle is a thin transparent layer held a sufficient distance above the mask that any particles are out of focus. However, conventional pellicle materials are not transparent to for EUV light.

Figure 6:
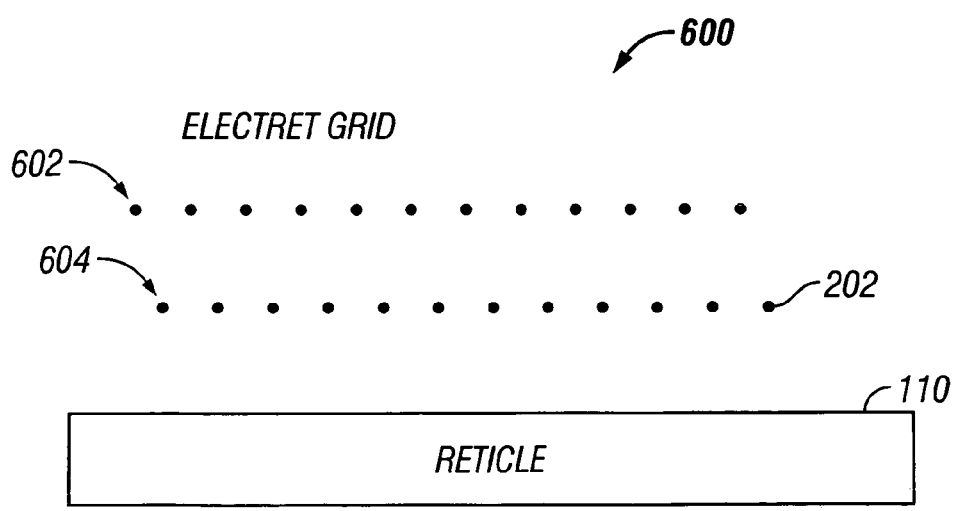
FIG. 6 is a sectional view of an EUV pellicle including a double-layer grid of electret fibers.

FIG. 6 shows a sectional view of an EUV pellicle 600 according to an embodiment. The electret fibers 202 may be attached to a frame, e.g., by threading though laser-drilled holes in the frame or by directly bonding the fibers to the frame. In an embodiment, the electret fibers have a diameter of 50 µm and a dipole of polarization 10 nC/cm$^2$ and radius of 1 mm.

The electret fibers may be arranged in a double-layer grid, including a first layer 602 and a second layer 604. The second layer of electret fibers may be needed because the field gradient in between the fibers in the first layer may be small and thus the force on a neutral particle may also be small. Placing the second layer of fibers in a staggered fashion helps to capture particles that might otherwise pass through the weak fields midway between fibers in the first layer. As described above, the dipole moments of the electret fibers may be chosen to be aligned in their minimum energy configuration, as shown in FIG. 2, to minimize twisting due to the interactions between the fibers.

Figure 7:
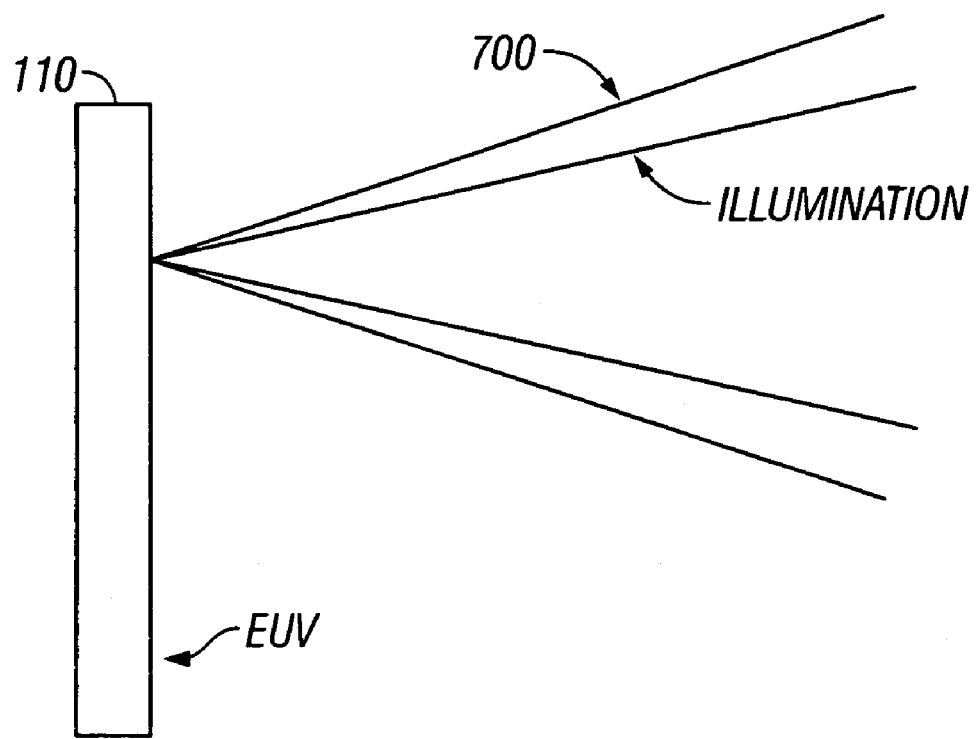
FIG. 7 shows an EUV mask with no protective pellicle being illuminated.

It is important that the pellicle not absorb too much light or form an image on the wafer. In an embodiment, the pellicle is placed 40 mm above the reticle. At a nominal distance of 40 mm from the reticle, the illumination cone 700 will be about 7 mm wide, as shown in FIG. 7. For a fiber size of 50 µm and a fiber spacing of 1 mm in two staggered layers, the illumination cone will capture about fourteen fibers so that the illumination uniformity will not change significantly as the reticle is scanned. There will be a geometrical loss of approximately 20% from the fibers, counting the double-pass after reflection off the reticle. Lower losses could be obtained with thinner fibers, although such wires would be less robust.

In an embodiment, the pellicle may remain attached to the mask to provide both in-tool and out-of-tool protection.

The principle advantage of the electret fibers over wire-based electrostatic grids is that they need no power supply, and thus can more easily ride along with the reticle both inside and outside of the lithography tool. The electret fiber pellicle may also have a compact nature that is straightforward to implement in tool or on the reticle and avoids the possibility of releasing particles due to the loss of power.

A number of embodiments have been described. Nevertheless, it will be understood that various modifications may be made without departing from the spirit and scope of the invention. Accordingly, other embodiments are within the scope of the following claims.

The invention claimed is:

1. A reticle carrier comprising:
   a first plurality of electret fibers;
   a second plurality of electret fibers;
   a reticle holder between the first plurality of electret fibers and the second plurality of electret fibers.

2. The reticle carrier of claim 1, wherein the reticle holder is adapted to hold an Extreme Ultraviolet (EUV) reticle.

3. The reticle carrier of claim 1, wherein the electret fibers are imbedded with dipole moments to capture particles.

4. The reticle carrier of claim 3, wherein each of a plurality of said electret fibers has a dipole field with a polarity of about 10 $nC/cm^2$.

5. The reticle carrier of claim 1, wherein the first plurality of electret fibers comprise a grid including a first layer of electret fibers and a second layer of electret fibers.

6. The reticle carrier of claim 5, wherein the electret fibers in the first layer and the second layer are staggered.

7. The reticle carrier of claim 1, wherein a plurality of said electret fibers have a thickness of about 100 μm.

8. The reticle carrier of claim 1, wherein a plurality of said electret fibers are aligned such that their dipole fields are aligned in their minimum energy configuration.

* * * * *